United States Patent [19]

Chang et al.

[11] 4,239,560
[45] Dec. 16, 1980

[54] OPEN TUBE ALUMINUM OXIDE DISC DIFFUSION

[75] Inventors: Mike F. Chang, Liverpool; David K. Hartman, Manlius; Richard W. Kennedy, Skaneateles; Alfred Roesch, Auburn, all of N.Y.; Henri B. Assalit, Torrance, Calif.

[73] Assignee: General Electric Company, Auburn, N.Y.

[21] Appl. No.: 40,881

[22] Filed: May 21, 1979

[51] Int. Cl.³ .......................................... H01L 21/223
[52] U.S. Cl. .................................. 148/189; 148/187; 148/190; 252/950; 252/951
[58] Field of Search ................ 148/189, 190; 252/950, 252/951

[56] References Cited
U.S. PATENT DOCUMENTS

| | | | |
|---|---|---|---|
| 3,314,833 | 4/1967 | Arndt et al. | 148/189 |
| 3,374,125 | 3/1968 | Goldsmith | 148/189 |
| 3,577,287 | 5/1971 | Norwich et al. | 148/189 |
| 3,644,154 | 2/1972 | Hoogendoorn et al. | 148/187 |
| 3,834,349 | 9/1974 | Dietze et al. | 148/189 X |
| 3,842,794 | 10/1974 | Ing | 148/189 X |
| 3,939,017 | 2/1976 | Ryugo et al. | 148/189 X |
| 4,040,878 | 8/1977 | Rowe | 148/188 |
| 4,141,738 | 2/1979 | Rapp | 148/189 X |

Primary Examiner—G. Ozaki
Attorney, Agent, or Firm—Robert J. Mooney; Stephen B. Salai

[57] ABSTRACT

A p-type region is formed in a semiconductor body by diffusion of aluminum from an aluminum oxide source in an open tube process. Both ceramic aluminum oxide and sapphire sources are described and an inert atmosphere of argon and hydrogen provides stable results. An alternative embodiment provides both the deep diffusion characteristics of aluminum with the high surface concentration of boron by using a boron nitride wafer carrier.

16 Claims, 6 Drawing Figures

SURFACE CONCENTRATION VS
DIFFUSION TEMPERATURE

OPEN TUBE ALUMINUM OXIDE DISC DIFFUSION

This invention relates in general to the formation of p-conductivity type regions in bodies of semiconductor material and more particularly to the use of solid aluminum oxide diffusion sources for open tube aluminum diffusion.

Aluminum is known to offer several advantages as a diffusant for forming p-conductivity type regions in semiconductor materials and especially in silicon. The diffusion coefficient of aluminum in silicon is three times higher than that of gallium and five times higher than that of boron. Aluminum provides a better fit within the silicon lattice than any other presently known p-conductivity type dopant. In high power semiconductor devices where deep junctions are required in order to obtain high breakdown voltages, aluminum diffusion has been utilized, although at high cost, in closed tube diffusion processes. Further, only relatively low surface concentrations have been obtainable in such systems. It has been believed that the presence of oxygen in the diffusion environment is at least partially responsible for the low surface concentrations obtainable. By aluminumizing the interior surface of a quartz diffusion tube, the attainment of higher surface concentrations has been claimed. Nevertheless, closed tube diffusion is time consuming and expensive. The diffusion tube must be evacuated and sealed prior to each diffusion cycle, and in many cases the diffusion tube is distorted or broken by the high temperatures encountered during the diffusion cycle or during opening of the tube so that it is not reuseable. The cost of closed tube diffusion is known to be high compared to open tube diffusion.

It is desirable therefore to provide an open tube diffusion process using an aluminum source which obviates some of the disadvantages of closed tube aluminum diffusion while retaining the advantages of high diffusion speed and the superior electrical and physical characteristics. Open tube aluminum diffusion processes have been described, for example, in U.S. Pat. No. 4,040,878 to Rowe. Rowe describes a system whereby metallic aluminum is selectively applied to the surface of a silicon wafer and the wafer is inserted in an open diffusion tube, which has a gas flow therethrough, and raised to a temperature sufficient to cause localized diffusion from the selectively applied solid aluminum source into the wafer. The method was addressed primarily to providing selective diffusion of isolation regions as would be useful in forming a number of discrete semiconductor devices on a single wafer which is divided into individual devices as a later step. It, therefore, requires preparation of the wafer to be diffused, by the application of an aluminum pattern thereto. Similar work has been described by Chang, et al., Ser. No. 943,451, U.S. Pat. No. 4,188,245 of common assignee herewith, who provides not only selectively located isolation diffusions but also provides a method for simultaneously forming a blanket diffusion and isolation diffusions in a single process. Both of these open tube aluminum processes are characterized by providing a flow of gas within a diffusion tube which is substantially free of oxygen which is known to readily combine with aluminum and to prevent diffusion.

It is desirable, in addition to forming selectively located regions of p-conductivity type, to be able to form blanket or overall regions of p-conductivity type in a semiconductor wafer. A commonly employed method for providing such regions is the use of gallium-germanium, or other p-type dopants. It is a disadvantage of all known p-type silicon dopants, except for aluminum, that the deep diffusion thereof into silicon requires considerable time. For example, in order to form a p-type layer having a thickness of 75 $\mu$m, gallium diffusion must be carried out for 48 hours at 1250° C. A similar depth layer formed with aluminum diffusion requires only 16 hours and provides significant mechanical and electrical advantages.

It has apparently been consistently believed that in order to successfully diffuse aluminum into a semiconductor body; and more particularly into silicon, from a diffusion source not directly on the surface of the target body, the presence of even a small amount of oxygen, which would effectively prevent the diffusion from taking place, must be avoided since aluminum is known to be a particularly easily oxidized material, especially at the high temperatures normally used for diffusion. It is the necessity for the elimination of oxygen from the diffusion ambient which has for so long dictated the use of closed diffusion tubes for aluminum diffusion, and more recently, resulted in the open tube aluminum diffusion processes which rely, at least in part for their success, on the flow through the diffusion tube of a gas stream which includes no more than a very small percentage of oxygen and which is otherwise inert with respect to aluminum. It is therefore extremely surprising and unexpected that aluminum oxide in any form can provide a useful source for aluminum diffusion.

It is an object of this invention to provide a method for forming a p-conductivity type layer in a semiconductor body through the use of aluminum diffusion in an open diffusion tube.

It is another object of this invention to provide an open tube aluminum diffusion process which is inexpensive and employs reuseable source wafers.

It is still another object of this invention to provide an open tube aluminum diffusion process which yields consistent and reproducible results in actual manufacturing operations.

These and other objects of the instant invention are achieved through the use of aluminum oxide diffusion sources in an open diffusion tube for forming a p-conductivity type region in a semiconductor material. In accordance with a preferred embodiment of this invention, aluminum oxide in the form of either high purity alumina ceramic or, in the alternative, sapphire discs, is disposed in an open diffusion tube in which a stream of inert gas is provided and in which target wafers are interleaved with the aluminum oxide source wafers. A presently preferred inert atmosphere includes 90% argon and 10% hydrogen gas. Surface concentrations on the order of $1-5 \times 10^{17}$ atoms/cm$^3$ are consistently provided in accordance with this method. In accordance with an alternative method according to this invention, sapphire discs of extremely high purity are employed as source wafers in an open tube aluminum diffusion process. All other conditions in the diffusion environment may be the same as for pressed alumina ceramic wafer diffusion sources. It has been found that in some cases polished sapphire wafers do not yield results which are as satisfactory as may be obtained by using "as cut" sapphire wafers.

Unexpectedly, the high level, injection lifetime of the carriers in the bulk of a semiconductor device formed in accordance with the instant invention, is found to be significantly higher than produced by prior art methods for forming p-conductivity type regions. The open tube aluminum oxide diffusion process not only offers the advantages of low cost and high speed, as well as lower residual stress in the crystal lattice, but additionally, provides superior electrical characteristics in a final device.

In accordance with a presently preferred embodiment of the invention, the uniformity of surface impurity concentration of a p-conductivity type region formed in accordance herewith is enhanced by selecting an appropriate carrier for the source and target wafers. Refractory metal carriers as will be hereinbelow discussed are found to yield particularly good results.

The features of the invention which are believed to be novel are pointed out with particularity in the appended claims. The invention itself, however, both as to its organization and method of operation together with further objects and advantages thereof may best be understood by reference to the following description taken in connection with the accompanying drawing in which:

Figure 1:
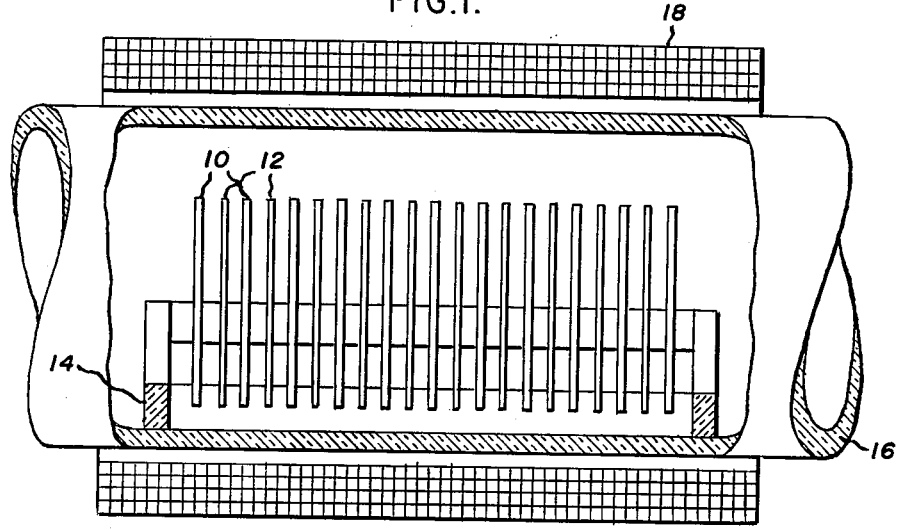
FIG. 1 is a diagrammatic view of an arrangement of target wafers and source wafers for a diffusion process in accordance with this invention.

FIG. 1 illustrates the disposition of a plurality of source wafers 10 and target wafers 12 in a wafer holder or boat 14 which maintains the wafers in an upright, spaced-apart position within a diffusion tube 16 which is disposed within a diffusion furnace represented herein by heating element 18. Source wafers 10 are fabricated of aluminum oxide either in the form of alumina ceramic of high purity or in the alternative of single crystal sapphire. Where aluminum oxide ceramic is employed as a diffusion source, it should be of high purity, at least 99.8% and preferably at least 99.9% pure or greater. Aluminum oxide ceramic wafers may be obtained from Coors Porcelain Company, Golden, Colorado.

It has been determined that open tube aluminum diffusion from an aluminum oxide source in accordance with this invention may be carried out at a temperature between about 1000° C. and 1250° C. Preferably, in order to obtain both a relatively short diffusion time and improved performance, as well as a satisfactory surface impurity concentration, diffusion is carried out at a temperature of about 1200° C. While it is currently preferred to position the source wafers and target wafers in spaced-apart, alternating fashion in a boat as illustrated at FIG. 1, the source and target wafers may, if desired, be stacked in alternating fashion on a quartz slab which may be directly loaded into the diffusion tube. It has been observed, however, that the quartz slab may be damaged during the diffusion process by the direct placement of aluminum oxide source wafers thereon when performing stacked diffusion, and where a diffusion source of sapphire is used, it is preferred that it not be lapped or polished, but rather should be utilized in the "as cut" state. By using such "as cut" sapphire wafers, surface impurity concentrations on the order of about $2 \times 10^{17}$ atoms/cm$^3$ are consistently obtained.

Where aluminum oxide ceramic is employed as a diffusion source, it is preferred that at least 99.9% pure discs be utilized. The use of discs of this purity or greater has been found to result in higher, high-level injection lifetime than where lower purity aluminum oxide is employed. While such high purity provides superior results, where lesser quality is required, somewhat lower purity aluminum oxide may be utilized at some cost saving.

Although it is preferable to load the source and target wafers in close proximity to each other, but not touching, this invention has been found to produce good results even when particularly large separations between the target wafers and the source wafers are used. For example, impurity concentrations on the order of $1-5 \times 10^{17}$ atoms/cm$^3$ have been obtained while utilizing spacing on the order of 125 mils. Those skilled in the art will recognize that certain economies result from closer spacing of the source and target wafers inasmuch as a larger number of wafers may be simultaneously processed.

While the prior art has recognized certain advantages in utilizing silicon diffusion tubes and silicon boats for open tube aluminum diffusion, it has been discovered that the use of such silicon apparatus is preferably avoided in accordance with this invention.

In accordance with an exemplary embodiment of the invention, six groups of silicon wafers were sequentially processed. The same aluminum oxide ceramic discs of 99.9% purity were utilized throughout the six cycles as a diffusion sources. Each diffusion cycle was carried out at 1200° C. for 20 hours. An inert gas flow within a 100 mm diameter open diffusion tube of two liters per minute of argon with 10% of hydrogen was employed. The rate of gas flow has not been found to be particularly critical. It is presently preferred to provide a flow of at least 10 ml/cm$^2$/min. and preferably between about 10-30 ml/cm$^2$/min. The following table summarizes the results obtained:

| No. of Runs | Impurity Concentration Atoms/cm$^3$ | Diffusion Depth μm |
|---|---|---|
| First | $2.5 \times 10^{17}$ | 51 |
| Second | $2.6 \times 10^{17}$ | 55 |
| Third | $2.6 \times 10^{17}$ | 53 |
| Fourth | $2.7 \times 10^{17}$ | 53 |
| Fifth | $2.7 \times 10^{17}$ | 53 |
| Sixth | $2.7 \times 10^{17}$ | 53 |

It will be seen that particularly consistent results are obtained with respect to surface impurity concentration and depth of diffusion. Further, as has been hereinabove described, especially favorable lifetime characteristics were obtained, averaging about 20 microseconds for the devices hereinabove described. The ability of the aluminum oxide ceramic discs to provide multiple diffusion cycles contributes to the low cost of methods in accordance with this invention.

Figure 2:
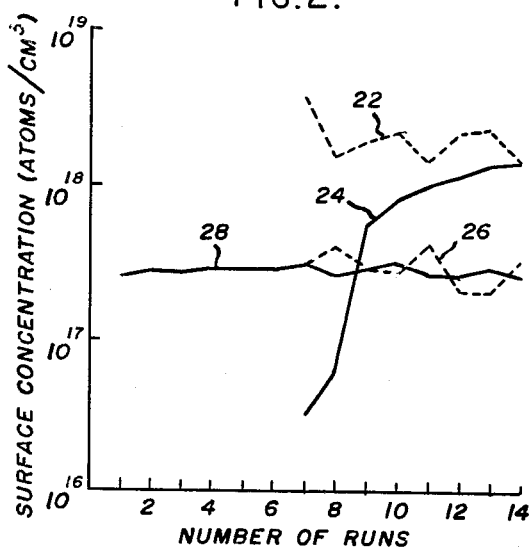
FIG. 2 is a graphical representation of the surface impurity concentration of a target wafer as a function of diffusion temperature.

FIG. 2 illustrates graphically the degree of consistency of surface impurity concentration obtainable in accordance with several embodiments of this invention. The surface concentration in atoms/cm$^3$ is plotted logarithmically along the ordinate while the number of runs utilizing the same diffusion source is plotted along the abscissa. Two sets of curves are presented. Curves 22 and 24 are for sapphire and ceramic aluminum oxide source wafers, respectively, in a diffusion process wherein 100% argon gas flow at two liters/minute was provided. Curves 26 and 28 are for sapphire and ceramic source wafers, respectively, in a diffusion process wherein 10% hydrogen was added to the argon gas flow. It will be appreciated with reference to the graph of FIG. 2 that the presence of 10% hydrogen in the inert gas flow substantially increases the stability of the ultimate surface concentration obtained over several cycles as compared with the pure argon gas flow. It is presently felt that the presence of hydrogen is most beneficial for diffusion processes wherein ceramic aluminum oxide is utilized. Hydrogen reduces the surface impurity concentration obtainable somewhat, but with the advantage that more consistent results are obtained where the diffusion source is reused. The use of hydrogen is felt to be less important for sapphire source wafers which are not affected by repeated use to the extent that ceramic wafers are affected. It will be observed that the aluminum oxide ceramic source wafers exhibit a tendency to provide increasingly consistent results as a function of the number of times they are employed in diffusion cycling. This stabilization of the source wafers with use appears to be independent of the use of hydrogen in the gas flow and suggests that, where desired, the necessity for including hydrogen may be minimized or eliminated by preliminary aging of the aluminum oxide source wafers prior to their use in a diffusion cycle for example for 20 or more hours at a temperature of at least 1000° C.

Figure 3:
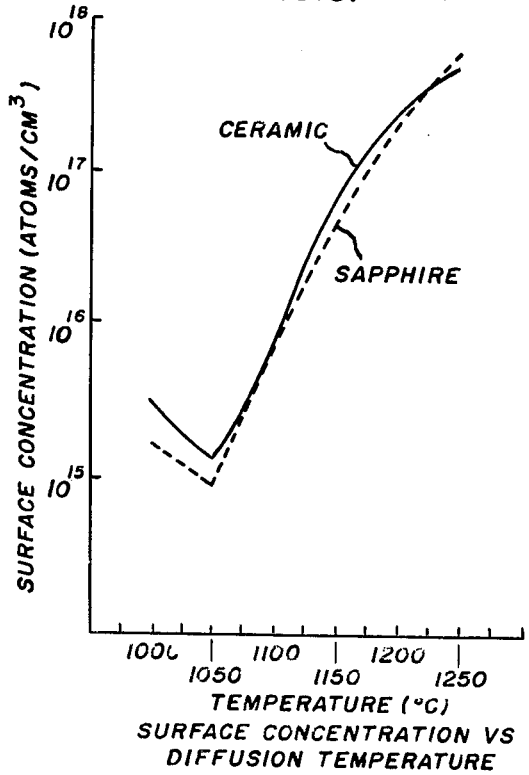
FIG. 3 is a graphic representation of the variation in surface concentration achieved for a number of target wafers processed in accordance with this invention.

FIG. 3 is a graph of the surface impurity concentration of a target wafer versus the diffusion temperature for ceramic and for sapphire aluminum oxide source wafers. The strong dependence of impurity concentration on temperature is clearly seen. This dependence is felt to be much stronger than the dependence of ultimate impurity concentration on time of diffusion. This relative independence on time and strong dependence on temperature results in the ability to obtain consistent surface impurity concentrations over many trials.

In accordance with a presently preferred embodiment of this invention, superior results are obtained through the use of refractory boats in accordance with the aluminum oxide diffusion process hereinabove described. For example, aluminum nitride, silicon carbide, silicon nitride, and aluminum oxide provide superior results when used as a material for fabricating boats or carriers for supporting the source and target wafers as hereinabove described. This improvement is felt to be due to the elimination of the tendency of quartz boats to deplete the surface concentration of silicon target wafers in the vicinity of the contact area between the wafers and the boats. The use of refractory boats produces a more uniform surface impurity concentration over the wafer area.

In order to insure a high degree of uniformity of the p-conductivity type region formed in accordance with this invention, it may be preferable to employ as a wafer carrier a boat which surrounds the source and target wafers and which itself acts as an auxiliary diffusion source. This invention includes therefore the use of a tubular aluminum oxide, preferably aluminum oxide ceramic boat, as illustrated in FIGS. 4 and 5.

Figure 4:
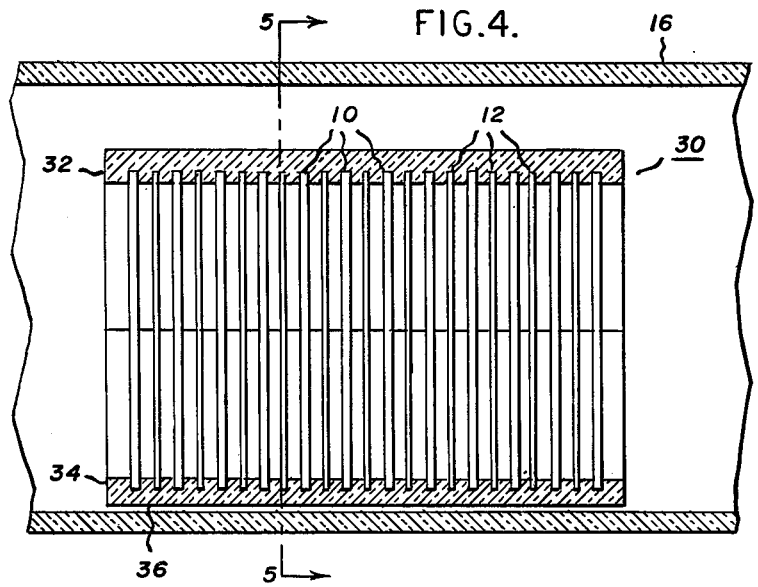
FIG. 4 is a side view of an alternative boat structure in accordance with this invention.
Figure 5:
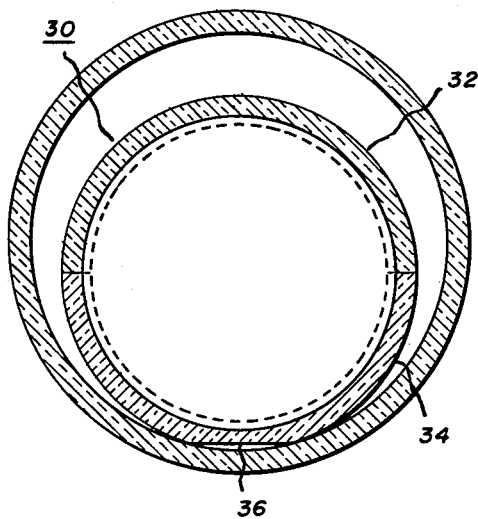
FIG. 5 is a section view of the boat of FIG. 4.

Referring now to FIG. 4, a wafer carrier 30 including an upper portion 32 and a cooperating lower portion 34 provides both support for source wafers 10 and target wafers 12 as well as acting as an auxiliary diffusion source during processing. Carrier 30 is provided with a flat 36 for allowing it to rest stably within open diffusion tube 16. A plurality of grooves is provided in at least bottom portion 34 of carrier 30 for supporting the source and target wafers in spaced-apart, upstanding relation. While the carrier illustrated includes grooves in both upper and lower portions 32 and 34, it is understood that, if desired, upper portion 32 may be made slightly larger than illustrated so as to clear the upper edges of the source and target wafers without the necessity for grooves.

While the thickness of the aluminum oxide discs whether in ceramic form or sapphire form is not believed to be critical, it has been found that ceramic aluminum oxide discs having a thickness of about 40 mils provide good results and exhibit sufficient mechanical strength so that excessive breakage does not occur during numerous reuses of the discs. Sapphire discs may be employed which are somewhat thinner, and 18 mil thickness having been found to provide good results. As has been hereinabove discussed, sapphire discs may be used "as cut" without polishing.

Where subsequent diffusion processes are performed after the aluminum diffusion, in accordance with this invention, it has been observed that substantial further improvement in lifetime occurs. In one example, upon completion of aluminum diffusion only, lifetimes on the order of five microseconds were measured. After subsequent diffusion, as for example, POCl$_3$ diffusion at 1200° C. for twelve hours, the lifetime increased to about 20 microseconds. Further improvement may be achieved, for example, by gettering with boron paint, resulting in ultimate diffusions of 23 to 37 microseconds, which is extremely good.

It is oftentimes desirable to provide a region of p conductivity type which is characterized both by a deep diffusion and a high surface concentration. While the aluminum oxide diffusion source alone provides a deep diffusion in a relatively short time as well as a surface concentration which is adequate for a variety of applications, even higher surface concentration may be desirable to achieve even better carrier injection in certain devices or to provide a better surface for attaching an ohmic electrode.

Accordingly, this invention includes a method for simultaneously diffusion aluminum and boron into a silicon wafer for providing a deep diffusion, on the order of 50 $\mu$m or more in combination with a surface impurity concentration of 10$^{18}$ atoms/cm$^3$ or greater. For the most part, the deep diffusion is attributable to the high diffusion coefficient of aluminum while boron provides high surface impurity concentration.

Simultaneous boron-aluminum diffusion in an open diffusion tube according to this invention is achieved by the simple expedient of utilizing a boron nitride wafer carrier along with the aluminum oxide diffusion source hereinabove described. The form of wafer carrier used may be either a simple 4-rail boat, or, preferably, the carrier illustrated in FIGS. 4 and 5.

Figure 6:
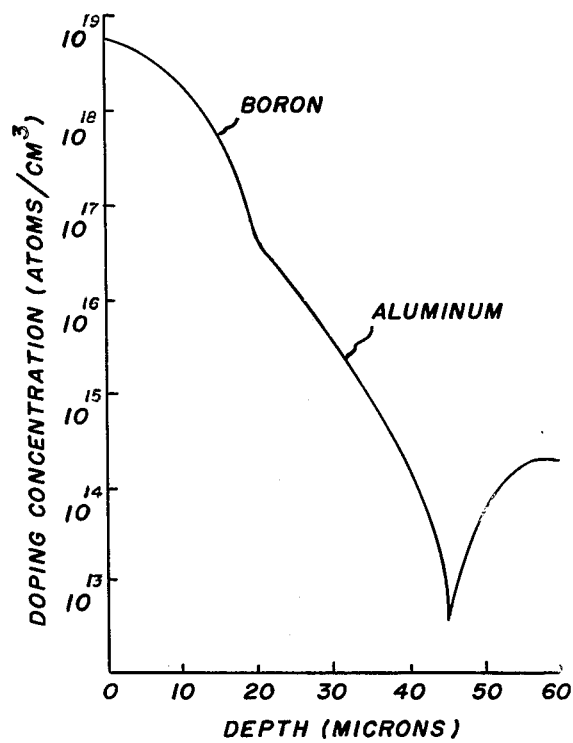
FIG. 6 is a graphical representation of the impurity concentration as a function of depth for a simultaneous boron and aluminum diffusion in accordance with this invention.

FIG. 6 illustrates graphically the impurity concentration as a function of depth for a target wafer simultaneously diffused with boron and aluminum as hereinabove described. The diffusion is carried out at 1200° C. for 20 hours in an atmosphere primarily of argon which includes 10% hydrogen; a flow rate of about 2 liters/min. in a 4-inch diffusion tube is provided. The hydrogen may be omitted if desired as has been hereinabove discussed.

While aluminum alone can be expected to produce a surface impurity concentration between about $2-5\times10^{17}$ atoms/cm$^2$, the combination of aluminum and boron is seen to provide a surface impurity concentration of about $5\times10^{19}$ atoms/cm$^3$ along with the depth of diffusion characteristic of the aluminum diffusion above. An impurity region is formed which is especially suited to high power semiconductor devices inasmuch as the high breakdown voltage characteristics of aluminum diffusion are combined with the low forward voltage drop resulting from the high carrier injection characteristic of the high surface concentration provided by the boron. These characteristics are provided at low cost with substantially longer lasting diffusion sources than heretofore possible in an open diffusion tube.

This invention may be advantageously practiced in accordance with the following exemplary embodiment thereof. A wafer carrier or boat is provided for supporting the semiconductor target wafers and the aluminum oxide source wafers in alternating fashion. The boat is cleaned as is well known to prevent contamination during diffusion. Cleaning methods well known to those skilled in the art are found to be adequate. For example, the boat may be cleaned by first degreasing in boiling ammonium hydroxide and hydrogen peroxide (about 50—50) followed by etching in hydrogen fluoride at room temperature, and further cleaning if necessary in boiling aqua regia. Aluminum oxide ceramic source wafers of 99.9% purity or greater are cleaned in 95% H$_2$SO$_4$ and 5% saturated Na$_2$Cr$_2$O$_7$ at about 100° C. for about 10 minutes. The clean discs are rinsed and then cleaned in boiling ammonium hydroxide and hydrogen peroxide followed by cleaning in boiling aqua regia, and rinsing. The Al$_2$O$_3$ discs are loaded into every other slot of the boat and placed into a 100 mm open quartz diffusion tube at 600°–650° C. having a flow of 100% argon therethrough at 2 liters/min. After loading, the temperature is increased to 1200° C. and 10% H$_2$ is added to the argon gas flow. The source wafers are preconditioned for about 50 hours at 1200° C. and then slow-cooled to about 600°–650° C. The boat is unloaded, taking care to provide a clean ambient. Conveniently, the boat may be unloaded into a quartz carrier which may be partially sealed and purged with dry nitrogen. Such a carrier is oftentimes referred to as a "white elephant."

The silicon target wafers are cleaned in ammonium hydroxide and in aqua regia, rinsed, and loaded into the empty positions of the boat, in alternating fashion, with the Al$_2$O$_3$ discs. The boat is replaced in the furnace at 600°–650° C. and the temperature slowly increased to the desired diffusion temperature. Preferably, the heating and cooling of the boat are carried out at 1°–10° C./min in order to avoid thermal shock to the source or target wafers, as well as to produce better device characteristics.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A method for diffusing aluminum into a semiconductor comprising:
    (a) disposing a semiconductor wafer in a diffusion tube;
    (b) disposing a single crystal sapphire source wafer in said tube; and
    (c) heating said tube to a temperature in excess of 1000° C.

2. The method of claim 1 wherein said method further comprises providing a flow of argon gas in said tube.

3. The method of claim 2 wherein providing said flow comprises providing a flow in excess of about 10 milliliter/cm$^3$ of tube cross-sectional area per minute through said tube.

4. The method of claim 2 wherein providing said flow further comprises providing at least some hydrogen along with said argon gas.

5. The method of claim 4 wherein providing said flow comprises providing a flow of between about 10 and 30 ml/cm$^2$/min.

6. The method of claim 1 wherein said sapphire source wafer has an "as cut" surface.

7. The method of claim 6 further comprising providing a flow of argon gas through said tube during said heating step.

8. The method of claim 7 further comprising providing about 10% hydrogen in said flow.

9. The method of claim 7 wherein said flow comprises a flow of between about 10 and 30 ml/cm$^2$/min.

10. A method for forming a uniform p-conductivity type region in an n-conductivity type silicon wafer from an aluminum oxide source comprising:
    providing an aluminum oxide wafer carrier;
    disposing a plurality of aluminum oxide source wafers in said carrier in spaced-apart relationship;
    disposing a plurality of silicon target wafers between said source wafers in said carrier; and
    heating said carrier, source wafers and target wafers in an open diffusion tube in an atmosphere of argon to a temperature sufficient to cause diffusion of aluminum atoms into said target wafers whereby such diffusion is substantially uniform over the surface of said target wafers.

11. The method of claim 10 wherein said wafer carrier comprises a bottom portion having grooves therein for supporting said source wafers and said target wafers in upstanding, spaced-apart relationship, and a top portion cooperating with said bottom portion to form a tube surrounding said wafers, said tube acting as an auxiliary diffusion source for increasing the uniformity of diffusion in the target wafers, especially at the edges thereof.

12. A method for forming a p-conductivity type region in a silicon semiconductor body, said region being a deep region for high voltage and having a high surface concentration comprising:
    providing a wafer carrier, said wafer carrier being fabricated of boron nitride;
    disposing a plurality of aluminum oxide source wafers into said carrier;
    disposing a plurality of silicon target wafers adjacent said aluminum oxide source wafers;
    heating said wafers and said carrier to a temperature in excess of 1000° C. to cause both aluminum from said aluminum oxide and boron from said boron nitride to simultaneously diffuse into said silicon target wafers.

13. The method of claim 12 wherein said heating comprises heating in an open diffusion tube having a flow of inert gas therein.

14. The method of claim 13 wherein said flow of gas is a flow of argon gas.

15. The method of claim 14 wherein said flow of gas further comprises about 10% hydrogen gas.

16. The method of claim 14 wherein said carrier comprises a tubular carrier having a top and a bottom portion cooperating to substantially surround said source and target wafers.

* * * * *